US008239115B2

(12) United States Patent
Ascher et al.

(10) Patent No.: US 8,239,115 B2
(45) Date of Patent: Aug. 7, 2012

(54) METHOD AND DEVICE FOR OFFSETTING BOUNCE EFFECTS IN A PIEZO-ACTUATED INJECTION SYSTEM OF AN INTERNAL COMBUSTION ENGINE

(75) Inventors: Stefan Ascher, Strasskirchen (DE); Reiner Lederle, München (DE); Hans-Jörg Wiehoff, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 774 days.

(21) Appl. No.: 11/722,323

(22) PCT Filed: Dec. 22, 2005

(86) PCT No.: PCT/EP2005/013959
§ 371 (c)(1),
(2), (4) Date: Nov. 24, 2009

(87) PCT Pub. No.: WO2006/069750
PCT Pub. Date: Jul. 6, 2006

(65) Prior Publication Data
US 2010/0063709 A1 Mar. 11, 2010

(30) Foreign Application Priority Data
Dec. 23, 2004 (DE) ......................... 10 2004 062 073

(51) Int. Cl.
*F02D 41/20* (2006.01)
*H01L 41/04* (2006.01)

(52) U.S. Cl. ...................... 701/103; 123/478; 239/102.2

(58) Field of Classification Search .......... 701/102–105; 123/445–447, 454–457, 449, 494, 498, 500, 123/511, 490; 239/88, 102.2
See application file for complete search history.

(56) References Cited

U.S. PATENT DOCUMENTS

| | | | | |
|---|---|---|---|---|
| 6,128,175 | A | 10/2000 | Wright et al. | 361/154 |
| 6,155,500 | A | 12/2000 | Takase | 239/533.3 |
| 6,276,337 | B1 * | 8/2001 | Minato | 123/456 |
| 6,491,017 | B1 * | 12/2002 | Mahr et al. | 123/299 |
| 6,575,138 | B2 * | 6/2003 | Welch et al. | 123/467 |
| 6,784,596 | B2 * | 8/2004 | Rueger et al. | 310/316.03 |

(Continued)

FOREIGN PATENT DOCUMENTS

DE 19854789 8/1999

(Continued)

OTHER PUBLICATIONS

Search Report for International Application No. PCT/EP2005/013959 (11 pages) Mar. 17, 2006.

*Primary Examiner* — John T. Kwon
*Assistant Examiner* — Johnny Hoang
(74) *Attorney, Agent, or Firm* — King & Spalding L.L.P.

(57) ABSTRACT

The invention relates to a method and a device for offsetting bounce effects in a piezo-actuated injection system of an internal combustion engine using a control valve actuated by a piezoelectric actuator. The inventive method comprises the following steps: detecting an actual bounce behavior of the control valve, and determining and offsetting a deviation between the actual bounce behavior and a desired bounce behavior of the control valve, thereby generating an actuation information for the control valve which influences a speed characteristic of a needle of the control valve. The invention also relates to a device for carrying out the inventive method.

12 Claims, 7 Drawing Sheets

U.S. PATENT DOCUMENTS

| | | | | |
|---|---|---|---|---|
| 7,198,203 | B2 * | 4/2007 | Brenk et al. | 239/96 |
| 7,275,522 | B2 * | 10/2007 | Beilharz et al. | 123/490 |
| 7,505,846 | B2 * | 3/2009 | Stoecklein et al. | 701/105 |
| 2003/0150429 | A1 * | 8/2003 | Rueger | 123/490 |
| 2004/0074477 | A1 * | 4/2004 | Mattes | 123/445 |
| 2005/0224598 | A1 * | 10/2005 | Potz et al. | 239/88 |
| 2005/0263133 | A1 * | 12/2005 | Magel | 123/446 |
| 2007/0069043 | A1 * | 3/2007 | Bogner | 239/102.2 |
| 2007/0261673 | A1 * | 11/2007 | Rueckle et al. | 123/445 |

FOREIGN PATENT DOCUMENTS

| | | |
|---|---|---|
| DE | 19921456 | 11/2000 |
| DE | 10311269 | 9/2004 |
| EP | 0995899 | 5/2001 |
| JP | 2000087822 | 3/2000 |
| WO | 03/083278 | 10/2003 |

* cited by examiner

METHOD AND DEVICE FOR OFFSETTING BOUNCE EFFECTS IN A PIEZO-ACTUATED INJECTION SYSTEM OF AN INTERNAL COMBUSTION ENGINE

CROSS-REFERENCE TO RELATED APPLICATIONS

This application is a U.S. national stage application of International Application No. PCT/EP2005/013959 filed Dec. 22, 2005, which designates the United States of America, and claims priority to German application number DE 10 2004 062 073.3 filed Dec. 23, 2004, the contents of which are hereby incorporated by reference in their entirety.

Method and device for offsetting bounce effects in a piezo-actuated injection system of an internal combustion engine.

The invention relates to a method and a device for offsetting bounce effects in a piezo-actuated injection system of an internal combustion engine in accordance with claims 1 and 9.

Pump-injector units (PDE) with a control valve actuated by a piezo actuator as an actuating element are used particularly in pressure-controlled injection systems of internal combustion engines. For this purpose, the control valve is used for controlling a fuel flow from a fuel low-pressure area into a pressure chamber of the pump-injector unit and for controlling a pressure curve within the pump-injector unit.

Investigations have shown that bounce effects within the control valve can have negative effects on system parameters of piezo-actuated injection systems. System parameters affected by this can, for example, include the start of hydraulic delivery, a pressure buildup behavior and distribution within the pump-injector unit. This can, inter alia, have detrimental effects on the accuracy of the injected fuel quantity in the pressure chamber. Detrimental effects of bounce can also include unstable pressure buildup behavior and undefined transitions between switching states of the control valve. Under certain circumstances, it is also possible for the bounce to cause unwanted pressure waves in the injection system.

The bounce of the control valve can detrimentally increase the instability of an operating behavior of the pump-injector unit, with the instability increasing in line with the intensity of the bounce. Elementary requirements for the control of piezo-actuated injection systems, such as equalization between the individual cylinders of the internal combustion engine and/or compensation for ageing and tolerances in injection elements for instance can also be detrimentally affected by the bounce of the control valve.

The object of the present invention is therefore to provide a method with which the described disadvantageous effects within the piezo-actuated injection systems are reduced. The object is achieved by a method according to claim 1 and by a device according to claim 9. Preferred developments of the inventive method are specified in the dependent claims.

The method according to the invention is provided for the compensation of bounce effects in a piezo-actuated injection system of an internal combustion engine, with the injection system including a control valve actuated by a piezo actuator. The method consists of the following method steps.

Detecting the actual bounce behavior of the control valve and

Determining and offsetting a deviation between the actual bounce behavior and a desired bounce behavior of the control valve, with control information being generated for the control valve, by means of which a speed characteristic of a needle of the control valve is influenced.

The method according to the invention is characterized in that an actual bounce behavior of the control valve is detected and any deviation between the actual bounce behavior and a desired bounce behavior of the control valve is determined and offset.

For this purpose, a speed characteristic of a needle of the control valve is influenced. In this way, a speed of a movement of the needle of the control valve can be minimized or largely eliminated according to a difference between the actual bounce behavior and the desired bounce behavior. A prompt detection and compensation for bounce patterns of the piezo-actuated injection system is therefore advantageously supported, with it being possible to compensate for the changes in the bounce pattern caused by long-term and short-term effects.

A preferred development of the inventive method provides that the speed characteristic of the needle is determined by a configuration of a stop phase in a charging and/or discharging operation of the piezo actuator. By means of the stop phase, the charging operation of the piezo actuator is divided into two phases interrupted by the stop phase. An amplitude of the stop phase in this case represents a controlled pre-stroke parameter with the aid of which the speed characteristic of the needle of the control valve can be advantageously influenced.

A further preferred embodiment of the method according to the invention provides that when offsetting the deviation between the actual bounce behavior and the desired bounce behavior of the control valve a minimization of areas between maxima in the capacitance characteristic of the piezo actuator and a reference line connecting the maxima takes place.

Due to the fact that the bounce of the control valve can be reflected in electrical signals by means to the piezoelectric effect, the bounce can be evaluated by a capacitance characteristic of the piezo actuator. The bounce of the control valve is reflected in the capacitance characteristic of the piezo actuator and can thus be accordingly minimized by minimizing the areas between the reference line connecting the capacitance maxima. This is achieved by an optimized control of the piezo actuator during charging, with a speed characteristic of the needle of the piezo actuator being formed in such a way that the needle strikes against the valve seat at optimum speed when the control valve is closing, and thus minimizes bounce. The minimized bounce is reflected in the minimized areas between the reference line connecting the capacitance maxima and the capacitance maxima of the piezo actuator.

An exemplary embodiment of the invention is described in more detail in the following with the aid of several figures, in which.

Figure 6A:
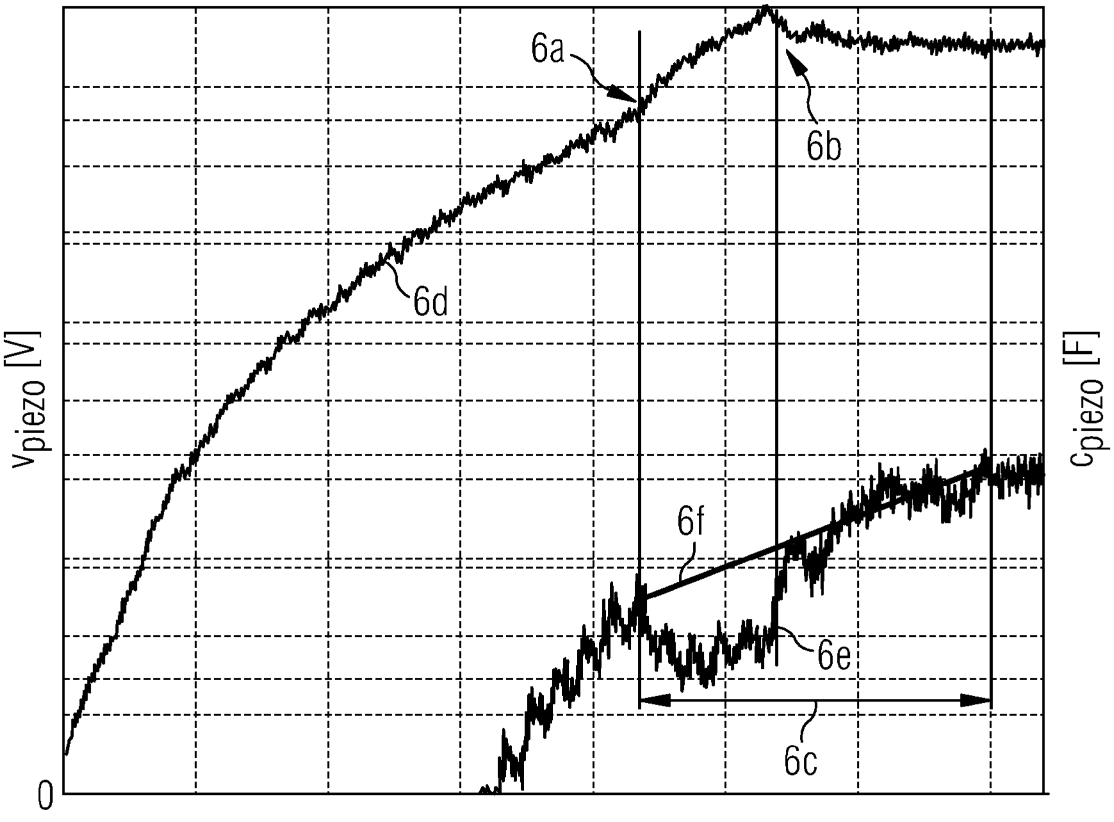

FIG. 6*a* shows characteristics, according to prior art, of the piezo voltage and piezo capacitance of a piezo actuator during bounce.

Figure 6B:
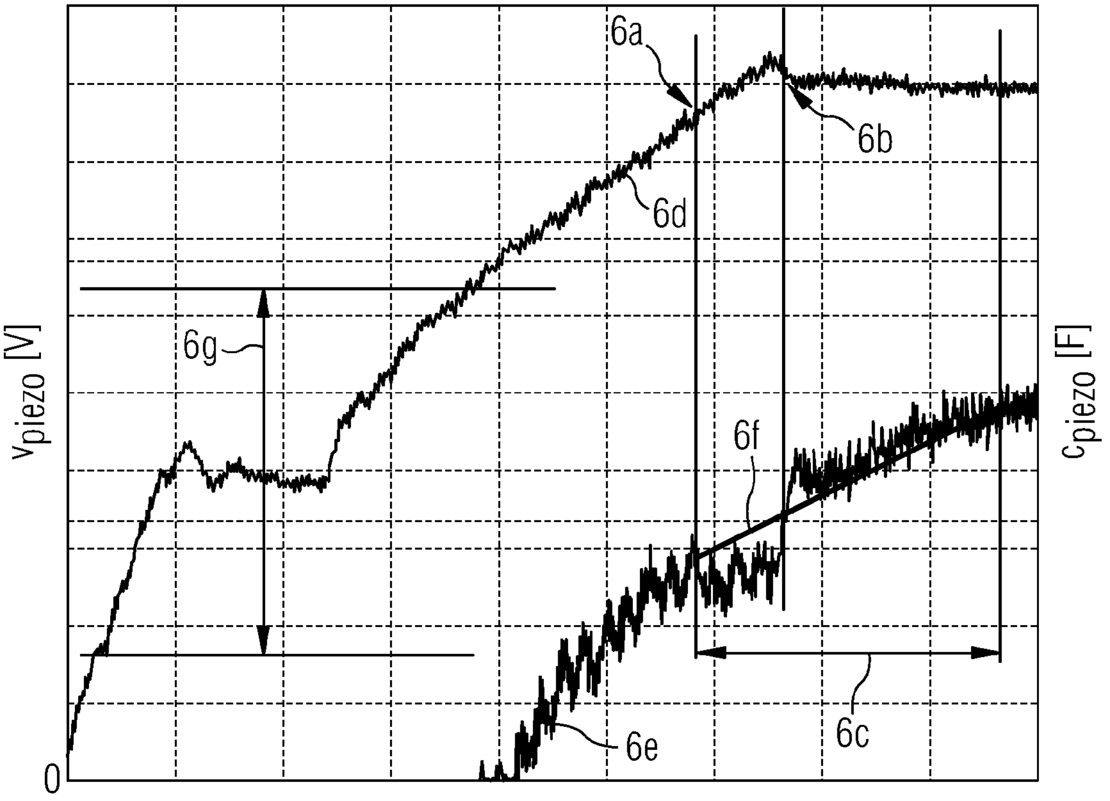
Figure 7:
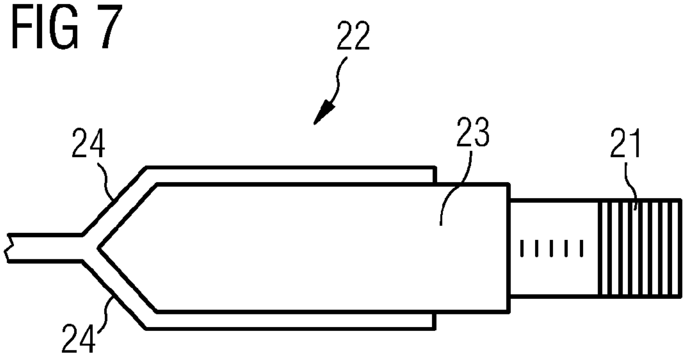

FIG. 6$b$ shows characteristics of the piezo voltage and piezo capacitance of a piezo actuator where the bounce is minimized according to the invention and FIG. 7 shows a basic representation of a control valve controlled by a piezo actuator as an actuating element.

Figure 1:
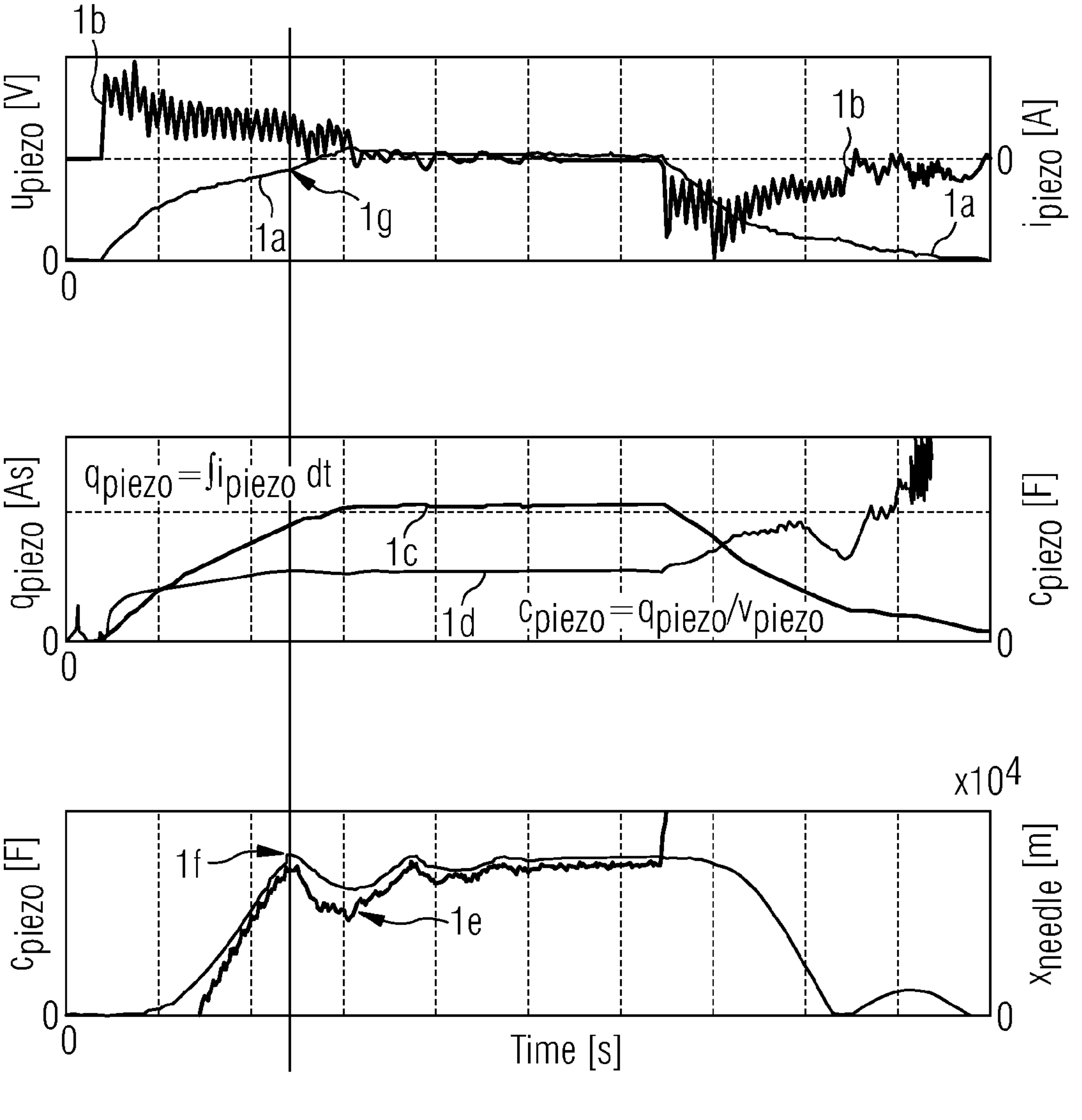
FIG. 1 shows the time characteristic of electrical signals and characteristic variables of a piezo actuator.

FIG. 1, in three illustrations, shows the time characteristic of electrical signals and characteristic variables of a piezo actuator for the control of a control valve in a pump-injector unit of an internal combustion engine. The illustration above shows a characteristic of a piezo voltage $U_{piezo}$ shown by 1$a$, and a characteristic of a piezo current $i_{piezo}$ shown by 1$b$, with which the piezo actuator is controlled. In the centre illustration, a time characteristic of characteristic variables of the piezo actuator calculated in a computational manner from the piezo voltage $U_{piezo}$ and the piezo current $C_{piezo}$ is shown. In this illustration, 1$c$ is a time characteristic of a piezo charge $q_{piezo}$ and 1$d$ is a time characteristic of a piezo capacitance $C_{piezo}$, which is determined by dividing the piezo charge $1_{piezo}$ by the piezo voltage $U_{piezo}$.

In the bottom illustration in FIG. 1, a mechanical stroke, shown by characteristic 1$f$, of an external reference sensor, which is arranged within the control valve for measuring purposes, is shown. It can be seen that the characteristic of the mechanical stroke 1$f$ has clearly pronounced extremes with maxima and minima which derive from a bounce of the control valve, especially a needle of the control valve. In one characteristic 1$e$, a time characteristic of the capacitance $C_{piezo}$ of the piezo actuator is shown. It can be seen that the characteristic of the piezo capacitance $C_{piezo}$ essentially correlates with the characteristic if of the mechanical stroke of the reference sensor.

This therefore is why the bounce of the control valve due to the piezoelectric effect can be depicted in the capacitance characteristic of the piezo actuator. In the bottom illustration, a first impact of the reference sensor on a valve seat of the control valve can be seen at approximately 0.25 ms in that the signal characteristic 1$f$ reaches a first maximum at this time point. Corresponding to this, a change of a gradient of the piezo voltage $U_{piezo}$ due to the piezoelectric effect can be seen in the top illustration of FIG. 1. Further maxima in the signal characteristic 1$f$ of the external reference sensor are reflected in a corresponding manner in the characteristic of the piezo voltage $U_{piezo}$ but are difficult to detect because of the coarse resolution of the top illustration. The changes in gradients of the piezo voltage $U_{piezo}$ due to the piezoelectric effect corresponds to changes in the current characteristic 1$b$.

A closing behavior of the piezo-activated control valve can be described using the electrical signal characteristics shown in FIG. 1. The relationship between the individual variables can be used for a qualitative assessment of a bounce effect of the valve needle. A simplified mathematical reconstruction model of the piezo actuator can be shown by the following.

$$f(t) = \frac{1}{d} * (q_{piezo}(t) - C_o * U_{piezo}(t))$$

$$s(t) = d * U_{piezo}(t) + \frac{S}{d} * (q_{piezo}(t) - C_o * U_{piezo}(t))$$

The parameters shown have the following meanings.

f(t) Force of the piezo actuator s(t) Mechanical stroke of the piezo actuator

S Small signal elasticity of the piezo actuator

D Piezoelectric charge constant $C_o$ Small signal capacitance of the piezo actuator $q_{piezo}$ Piezo charge $U_{piezo}$ Piezo voltage From the mathematical relationships it can be seen that at a measurement of the piezo charge $q_{piezo}$ the piezo voltage $U_{piezo}$ and the small signal capacitance $C_o$ the force and the mechanical stroke of the piezo actuator can be calculated taking account of the piezoelectric charge and elasticity relationships.

Figure 2:
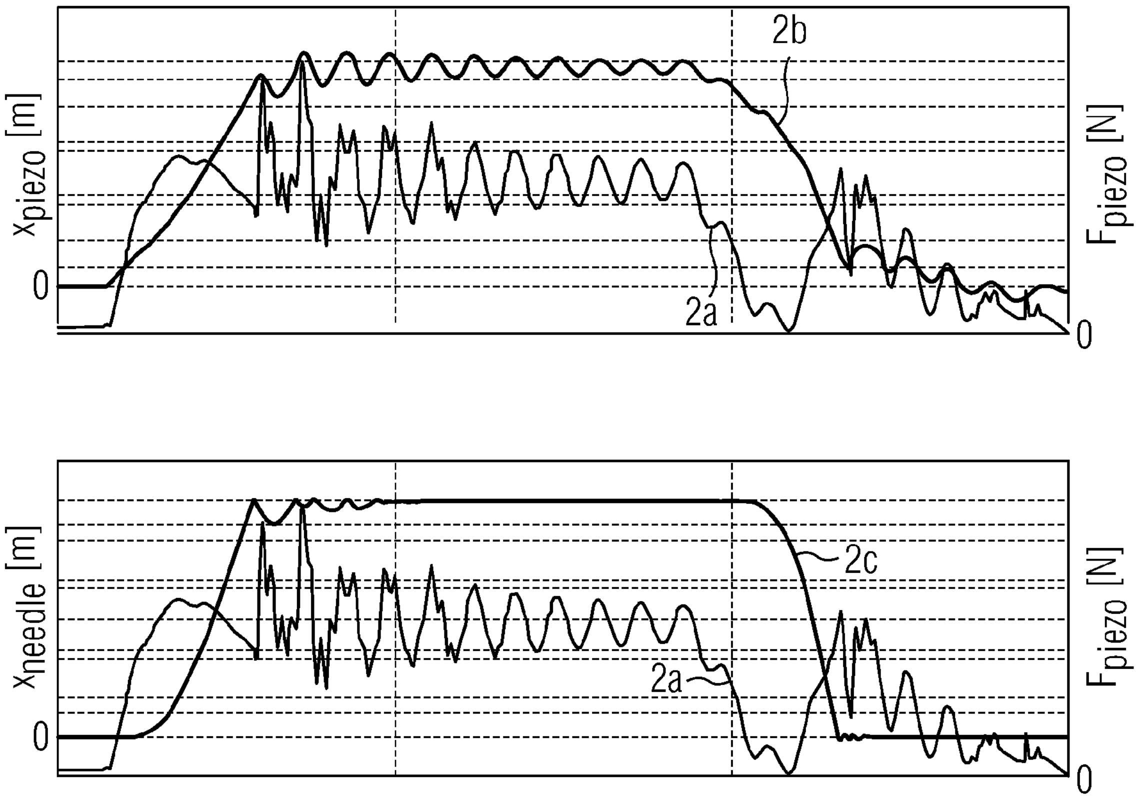
FIG. 2 shows two graphs which show the relationship between a force input into the piezo actuator and a mechanical stroke of the piezo actuator and/or of a control valve needle controlled by the piezo actuator.

FIG. 2 shows, in two illustrations, simulated characteristic shapes of a force input $F_{piezo}$ to the piezo actuator, and the resulting mechanical strokes. In the top illustration, a time characteristic 2$a$ of the force input $F_{piezo}$ in the piezo actuator is shown. The resulting time characteristic of a mechanical stroke of the piezo actuator is shown by 2$b$. Corresponding to this, a time characteristic of a mechanical stroke of a needle of the control valve is shown as 2$c$ in the bottom illustration of FIG. 2. The differences in the characteristics 2$b$ and 2$c$ result therefore in that between the piezo actuator and the control valve needle a transmission path is arranged which damps the mechanical stroke of the piezo actuator.

Figure 3:
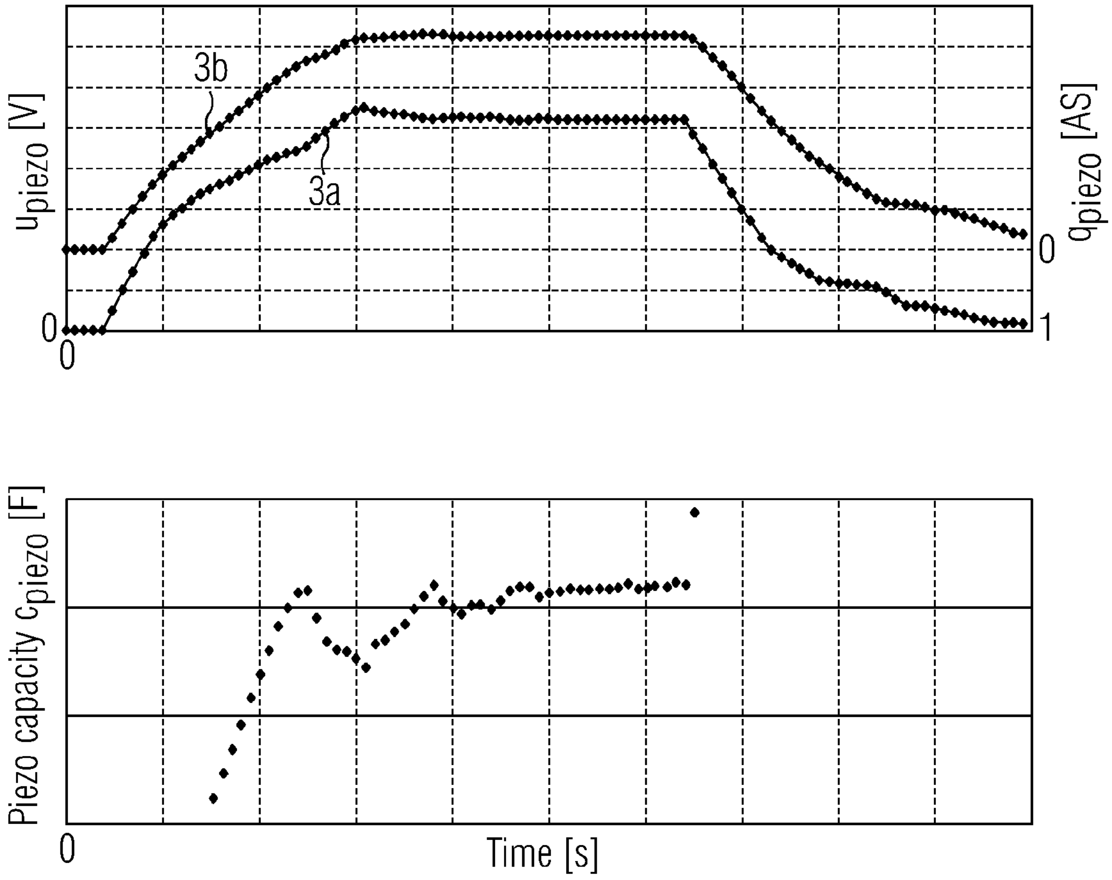
FIG. 3 shows two graphs which show the sampled electrical signals of the piezo actuator and a capacitance characteristic of the piezo actuator determined from same.

FIG. 3 shows, in two illustrations, electrical variables of the piezo actuator sampled at intervals by means of a sample process and a time characteristic of the piezo capacitance $C_{piezo}$ of the piezo actuator calculated from this. In the top illustration, 3$a$ shows a time characteristic of the sampled piezo voltage $U_{piezo}$. Item 3$b$ shows a characteristic of the piezo charge $q_{piezo}$ corresponding to the sampled piezo voltage $U_{piezo}$, which is determined from an integration of the piezo current $i_{piezo}$. The bottom illustration in FIG. 3 shows a time characteristic of the piezo capacitance $C_{piezo}$ of the piezo actuator determined from the sampled values of the piezo voltage $U_{piezo}$ and piezo charge It can be clearly seen that the characteristic of the piezo capacitance $C_{piezo}$ due to the bounce of the control valve, which is reflected in electrical signals of the piezo actuator due to a feedback effect, has pronounced extremes. The bottom illustration of FIG. 3 shows the characteristic 1$e$ of the piezo capacitance $C_{piezo}$, in sampled form, of the bottom illustration of FIG. 1. By a simultaneous sampling of the piezo charge $q_{piezo}$ and the piezo voltage $U_{piezo}$, conclusions can be drawn regarding the approximate qualitative characteristic shapes of the piezo stroke s(t) and piezo force f(t), which according to the above formula correspond to the piezo charge $q_{piezo}$ and the piezo voltage $U_{piezo}$.

Figure 4:
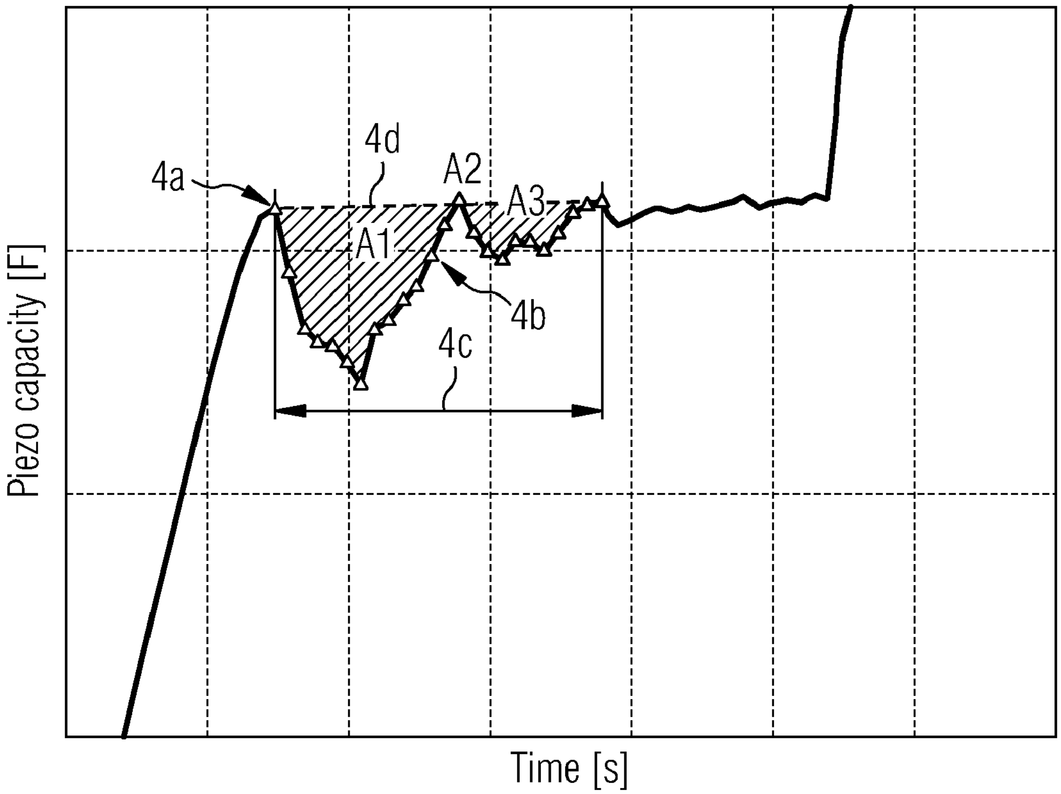
FIG. 4 shows an enlarged view of the capacitance characteristic of the bottom illustration in FIG. 3.

FIG. 4 shows an enlarged representation of the bottom illustration from FIG. 3. The sampled characteristic of the piezo capacitance $C_{piezo}$ is shown, with 4$a$ representing a first maximum of the piezo capacitance $C_{piezo}$. This first maximum results from a first impact of the needle of the control valve on the valve seat when the control valve closes. Item 4$b$ is an example of a sampled, discrete value from the characteristic of the piezo capacitance $C_{piezo}$. Item 4$c$ represents a time acquisition window in which, in the inventive method, the characteristic of the piezo capacitance $C_{piezo}$ is acquired. Item 4$d$ represents a reference line that connects the individual maxima in the characteristic of the piezo capacitance $C_{piezo}$ within the acquisition window 4$c$ with each other and is used for a definition of areas between the reference line and the characteristic of the piezo capacitance $C_{piezo}$. Items A1, A2 and A3 represent areas that are acquired, according to the invention, between the reference line 4$d$ and maxima in the characteristic of the piezo capacitance $C_{piezo}$. The reference line is formed as a straight line between adjacent maxima of the characteristic of the piezo capacitance. Areas A1 and A3 are arranged below the reference line and area A2 above the reference line.

It can be seen from FIG. 4 that the bounce on the needle of the control valve in the characteristic of the piezo capacitance $C_{piezo}$ is reflected in such a way that the areas A1, A2 and A3 increase in size with the severity of the bounce of the needle. The extent of area A2, which can be caused by the overshoot of the needle after the impact on the valve seat, is shown as essentially zero in the representation in FIG. 4.

The size of the area between the characteristic of the piezo capacitance and the reference line between maximum values, i.e. local maxima of the piezo capacitance within a specified time acquisition window, is used as a control variable in order to reduce the bounce of the needle. Furthermore, the control valve is controlled in such a way that the areas between the reference line and the characteristic of the piezo capacitance are minimized within the time acquisition window. The smaller the area the less pronounced the bounce behavior of the needle of the control valve. The acquisition window preferably begins and ends at a local maxima of the piezo capacitance.

Figure 5:
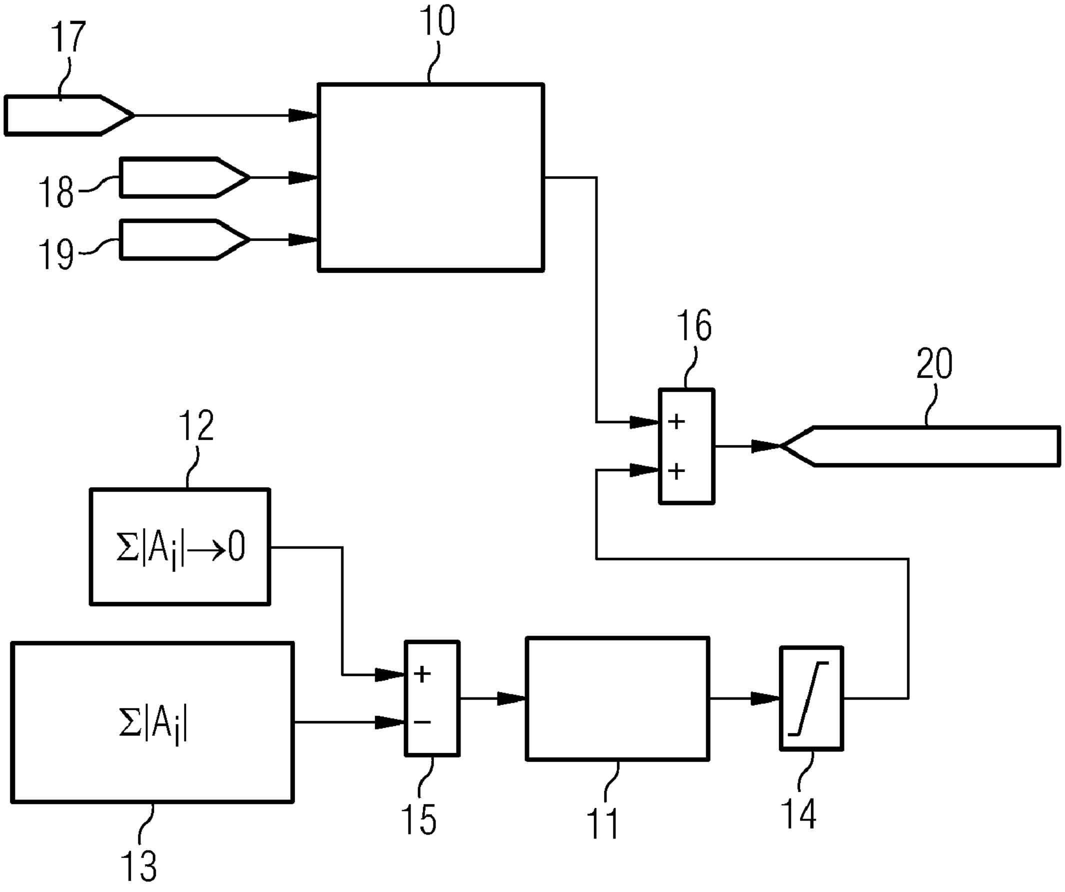
FIG. 5 shows an exemplary embodiment of a device by means of which the inventive method can be implemented.

FIG. 5 shows a schematic block diagram of a device by means of which the inventive method is performed. With the aid of an acquisition device 13, the areas, shown in FIG. 4, between the reference line 4*d* and the maxima in the characteristic of the piezo capacitance $C_{piezo}$ are acquired and summarized and an absolute value of the sum of the areas is applied to a summation point 15 with a negative sign. A desired value default device 12 is used to specify a minimized extent of the acquired areas with a value which is essentially zero being desirable. The starting value of the desired value default device 12 thus corresponds essentially to a desired quantity of the sum of the areas, which is also applied to the summation point 15. A differential value between the area total acquired by the acquisition device 13 and a desired value of the sum of the areas in the characteristic of the piezo capacitance $C_{piezo}$ therefore represents a starting value of the summation point 15. The output value at the summation point 15 thus corresponds essentially to a control differential, which is applied to a control device 11.

The control device 11 adjusts the supplied control differential and, for this purpose, generates time control input information for the piezo actuator. The time control input information can, for example, include a number of charging steps in a charging operation of the piezo actuator. Furthermore, the generated control input information is applied to a limiter 14 which essentially represents a plausibility check. The control input information generated by the control device 11 and limited by the limiter 14 is then applied to an adding device 16.

A first operating parameter 17 of the internal combustion engine, a second operating parameter 18 of the internal combustion engine and a third operating parameter 19 of the internal combustion engine are applied to a pilot control device 10. The first operating parameter 17, the second operating parameter 18 and the third operating parameter 19 furthermore model a system state of the internal combustion engine by means of mapped data. For example, the first operating parameter 17 can include a closing time of the control valve, the second operating parameter 18 a rotational speed of the internal combustion engine and the third operating parameter 19 various physical environmental variables of the internal combustion engine. By means of the pilot control device 10, a pilot control or initial value for the time control input information of the piezo actuator is generated and also applied to the adding device 16 via an output of the pilot control device 10.

The input control information generated by the pilot control device 10 can, for example, be a rough estimated value for the configuration of the stop phase in the charging operation of the piezo actuator. By means of a pilot control algorithm implemented in the pilot control device 10, time information can thus be generated for the first charging time up to the stop phase. This must always be less than the closing time of the control valve.

By means of the adding device 16, the time input control information generated by the pilot control device 10 and the control device 11 are added and are available at the output of the adding device 16 as a fourth operating parameter 20 of the internal combustion engine for control of the piezo actuator. The fourth operating parameter 20 thus represents a final value of a number of charging steps in the first phase of the charging operation of the piezo actuator up to the stop phase.

By means of the fourth operating parameter 20, it is possible to configure the length of the stop phase and/or the part/level of the stop phase so that it can be varied in order to influence the speed characteristic of the needle of the control valve. The configuration of the stop phase within the charging operation of the piezo actuator can, in addition to the named amplitude, also include a time duration of the stop phase. A speed characteristic of the needle of the control valve can be optimized in this way so that an impact of the needle on the valve seat is on one hand well defined and on the other hand designed to be essentially bounce free. In its basic design, the device shown in FIG. 5 thus represents a control circuit that influences a speed of the needle of the control valve, as a function of the explained summed area differential, in such a way that the bounce of the needle is reflected as little as possible in the characteristic of the piezo capacitance $C_{piezo}$ of the piezo actuator.

The inventive device shown in FIG. 5 thus implements a strategy for configuration of the stop phase. The control algorithm implemented by the control device 11 determines a residual error value from the applied area information and adds this to the pilot control value.

FIG. 6*a* shows the basic time characteristics of the piezo voltage $U_{piezo}$ and of the piezo capacitance $C_{piezo}$ in a closing operation of the control valve, according to prior art. Item 6*d* shows a characteristic of the piezo voltage $U_{piezo}$ which at a point 6*a* of closing of the control valve experiences a change of the gradient due to the piezoelectric effect. It can be clearly seen that from this time point the piezo voltage $U_{piezo}$ has a steeper pattern than before the time point of the closing of the control valve. Item 6*e* shows a characteristic of the piezo capacitance $C_{piezo}$, which is determined using the method explained in conjunction with FIG. 3. It can be seen that at the time point of the closing of the control valve a pronounced non-linearity in the characteristic of the piezo capacitance $C_{piezo}$ is generated due to the bounce of the control valve. The charging operation of the piezo actuator is ended at a time point, indicated by 6*b*. Item 6*c* indicates the time acquisition window used to perform the method according to the invention. Reference line 6*f* connects the maxima in the characteristic of the piezo capacitance $C_{piezo}$ between time end-points of the acquisition window 6*c*. The prominence of the area between the reference line 6*f* and the characteristic of the piezo capacitance $C_{piezo}$ within the acquisition window 6*c* due to the bounce of the control valve can be clearly seen. In FIG. 6B, according to the invention a stop phase is inserted after a first charging phase within the charging operation of the piezo actuator. This can be seen in that the characteristic of the piezo voltage $U_{piezo}$ is essentially constant during the stop phase. The amplitude of the stop phase can be varied according to the invention and is indicated by 6*g*. It can be seen that because of the insertion of the stop phase into the charging operation of the piezo actuator from time point 6*a* of the closing of the control valve the gradient of the piezo voltage $U_{piezo}$ is essentially continuous. Furthermore, it can be seen in the characteristic of the piezo capacitance $C_{piezo}$ that the areas between the reference line 6*f* and the extremes in the characteristic of the piezo capacitance $C_{piezo}$ in the acquisition window 6*c* are minimized or reduced.

The present invention is regarded as particularly advantageous in that by a variation of the amplitude of the stop phase the charging phase of the piezo actuator can be influenced in such a way that a speed characteristic of the control valve at which the bounce of the control valve is compensated is achieved. This can, for example, be achieved in that during the stop phase no current is applied to the piezo actuator, thus resulting in a reduction in the speed of the needle of the control valve. This results in a prevention of further acceleration of the needle of the control valve so that bouncing or re-bouncing at the impact time point of the control valve needle on the valve seat is largely eliminated.

Furthermore, it is regarded as advantageous that by means of a prompt acquisition of the electrical signals and characteristic variables of the piezo actuator and evaluation during a control valve closing/opening phase, the bounce behavior of each individual pump-injector unit can be individually observed and compensated for at the time by means of an activator or control device, such as is shown in FIG. 5. Changing bounce patterns in the control valve of the pump-injector unit can be adaptively compensated for by the method according to the invention during the operation of the internal combustion engine.

By means of the inherent sensor-system properties of the piezo actuator due to utilization of the piezoelectric effect, an expensive and cost-intensive sensor system for acquisition of electrical signals and characteristic variables can be advantageously saved. It is obvious that for the compensation of the bounce according to the invention the stop phase can also be inserted into a discharging operation of the piezo actuator.

In an alternative embodiment of the invention, it is also conceivable that instead of using the summed area differential as a control variable the force and/or mechanical stroke of the piezo actuator determined by means of the piezoelectric effect can be used.

FIG. 7 is an illustration of the principle of a control valve 22 with which the invention can be implemented. In this case, the control valve 22 is controlled by means of a piezo actuator 21 that forcefully impacts a needle 23. Due to the force introduction of the piezo actuator 21 to the needle 23 the needle 23 is pushed against a valve seat 24 with, according to the invention, bouncing of the needle 23 due to the impact on the valve seat 24 being minimized.

The features of the invention disclosed in the description, the claims and the drawings can be essential both individually and also in any combination for the implementation of the invention.

In one development, the invention relates to a method for compensation of the bounce effects in a piezo-actuated injection system of an internal combustion engine with a control valve actuated by a piezo actuator, with the following method steps:

- Acquisition of an actual bounce behavior of the control valve and
- determination and offsetting of a deviation between the actual bounce behavior and a desired bounce behavior of the control valve, with the control valve being controlled in such a way that the speed of the needle of the control valve is influenced, with the areas between a capacitance characteristic of the piezo actuator and a reference line connecting the maxima of the capacitance characteristic being minimized during he offset of the deviation between the actual bounce behavior and the desired bounce behavior of the needle.

In a further embodiment, the invention relates to a device for compensation of bounce effects in a piezo-controlled injection system of an internal combustion engine, with the injection system having a control valve 22 actuated by a piezo actuator 21, with the device including an acquisition device 13 for acquiring an actual bounce behavior of the control valve 22 and a deviation between the actual bounce behavior and the desired bounce behavior of the control valve 22, with the device also including a control device 11 for offsetting the deviation between the actual bounce behavior and desired bounce behavior, with an input control information for the control valve 22 being generated, with areas between a capacitance characteristic of the piezo actuator and a reference line being minimized in a time acquisition window during the offsetting of the deviation between the actual bounce behavior and the desired bounce behavior, with the reference line being formed as a straight line between local maxima of the capacitance characteristic.

The invention claimed is:

1. A method for offsetting bounce effects in a piezo-controlled injection system of an internal combustion engine, with a control valve actuated by a piezo actuator, the method comprising:

- determining an actual bounce behavior of the control valve,
- determining a deviation between the actual bounce behavior and a desired bounce behavior of the control valve, and
- based on the determined deviation between the actual bounce behavior and the desired bounce behavior of the control valve, configuring a stop phase for a charging operation or a discharging operation of the piezo actuator, the stop phase dividing the charging operation or the discharging operation into two phases interrupted by the stop phase, such that a speed characteristic of the needle of the control valve is influenced by the stop phase interrupting the charging operation or the discharging operation of the piezo actuator.

2. The method of claim 1, with the actual bounce behavior of the control valve being determined based on a piezoelectric effect.

3. The method as claimed in claim 1, comprising:

- determining charging and voltage values for the piezo actuator; and
- determining a sampling of the charging and voltage values of the piezo actuator and a capacitance characteristic of the piezo actuator based on the charging and voltage values.

4. The method of claim 1, including determining a pilot valve value of the stop phase.

5. The method of claim 4, with the stop phase being defined by a corresponding number of charging steps for the piezo actuator.

6. The method of claim 1, wherein the stop phase is configured to reduce an area between maxima in a capacitance characteristic of the piezo actuator and a reference line connecting the maxima.

7. The method of claim 1, with the method being adaptively performed during an operation of the internal combustion engine.

8. The method of claim 1, wherein the stop phase is configured such that during the stop phase, a piezo voltage is maintained substantially constant as compared to a variability of the piezo voltage before and after the stop phase.

9. The method of claim 1, wherein the stop phase is configured such that no current is applied to the piezo actuator during the stop phase.

10. A device for compensation of bounce effect in a piezo-controlled injection system of an internal combustion engine, with the injection system having a control valve actuated by a piezo actuator, the device including:

an acquisition device for acquiring an actual bounce behavior of the control valve; and a control device for:

determining a deviation between the actual bounce behavior and a desired bounce behavior of the control valve, and based on the determined deviation between the actual bounce behavior and the desired bounce behavior of the control valve, configuring of a stop phase in a charging operation or a discharging operation of the piezo actuator, the stop phase dividing the charging operation or the discharging operation into two phases interrupted by the stop phase, such that a speed characteristic of the needle of the control valve is influenced by the stop phase interrupting the charging operation or the discharging operation of the piezo actuator.

11. The device of claim 10, wherein the stop phase is configured such that during the stop phase, a piezo voltage is maintained substantially constant as compared to a variability of the piezo voltage before and after the stop phase.

12. The device of claim 10, wherein the stop phase is configured such that no current is applied to the piezo actuator during the stop phase.

* * * * *